United States Patent [19]

Capote et al.

[11] Patent Number: 5,565,267
[45] Date of Patent: Oct. 15, 1996

[54] COMPOSITE SUBSTRATES FOR PREPARATION OF PRINTED CIRCUITS

[75] Inventors: Miguel A. Capote, Carlsbad; Michael G. Todd, Vista, both of Calif.

[73] Assignee: Toranaga Technologies, Inc., Carlsbad, Calif.

[21] Appl. No.: 478,453

[22] Filed: Jun. 7, 1995

Related U.S. Application Data

[62] Division of Ser. No. 188,658, Jan. 26, 1994, which is a continuation of Ser. No. 903,042, Jun. 23, 1992, abandoned, which is a continuation-in-part of Ser. No. 769,892, Oct. 1, 1991, Pat. No. 5,376,403, which is a continuation-in-part of Ser. No. 477,678, Feb. 9, 1990, abandoned.

[51] Int. Cl.⁶ .............................. H01B 1/02; H01B 1/22
[52] U.S. Cl. ...................... 428/344; 428/458; 428/901; 252/512; 252/513; 252/514; 252/518
[58] Field of Search .................................. 428/344, 901, 428/458; 252/512, 513, 514, 518

[56] References Cited

U.S. PATENT DOCUMENTS

| | | | |
|---|---|---|---|
| 4,077,927 | 3/1978 | McPherson | 428/458 |
| 4,118,535 | 10/1978 | Banucci et al. | 428/458 |
| 4,163,030 | 7/1979 | Banucci et al. | 428/458 |
| 4,327,124 | 4/1982 | DesMarais, Jr. | 427/96 |
| 4,353,954 | 10/1982 | Yamaoka et al. | 428/418 |
| 4,368,281 | 4/1982 | Brummett et al. | 523/458 |
| 4,396,666 | 8/1983 | Ernsberger | 428/208 |
| 4,457,861 | 7/1984 | DesMarais, Jr. | 252/512 |
| 4,686,653 | 8/1987 | Iwasa | 29/830 |
| 4,789,411 | 12/1988 | Eguchi et al. | 148/24 |
| 4,839,229 | 6/1989 | Jellinek et al. | 428/413 |
| 4,876,120 | 10/1989 | Belke et al. | 428/458 |
| 4,942,095 | 7/1990 | Buchert et al. | 428/458 |
| 4,985,297 | 1/1991 | Tomaru et al. | 428/458 |
| 4,996,005 | 2/1991 | Saito et al. | 252/512 |
| 5,002,818 | 3/1991 | Licari et al. | 428/413 |
| 5,043,102 | 8/1991 | Chen et al. | 428/413 |

FOREIGN PATENT DOCUMENTS

| | | |
|---|---|---|
| 1190736 | 7/1985 | Canada . |
| 0261868 | 11/1989 | Germany . |
| 60-149670 | 8/1985 | Japan . |
| 63-125582 | 5/1988 | Japan . |

OTHER PUBLICATIONS

Rutledge, "Modeling Chain Rigidity and Orientation in Liquid Crystalline Polymers", Polymer Preprints, 33(1), pp. 537–538.

*Primary Examiner*—Marion E. McCamish
*Assistant Examiner*—Blaine R. Copenheaver
*Attorney, Agent, or Firm*—Burns, Doane, Swecker & Mathis, L.L.P.

[57] ABSTRACT

Substrates for printed circuit boards and the like, in the form of a substrate base layer and at least one adherent layer fixedly attached thereto. The adherent layer preferably comprises a thermoplastic material having a glass transition temperature in the range of about 180° and about 245° C., or a thermosetting material capable of B-stage curing. The preparation of the novel substrates and printed circuits using the substrates and conductive traces formed with electrically-conductive ink compositions is also described.

17 Claims, No Drawings

COMPOSITE SUBSTRATES FOR PREPARATION OF PRINTED CIRCUITS

This application is a divisional of application Ser. No. 08/188,658 filed on Jan. 26, 1994 (now allowed) which is a continuation of Ser. No. 07/903,042 filed on Jun. 23, 1992, now abandoned, which is a continuation in part application of Ser. No. 07/769,892 filed on Oct. 1, 1991 (now U.S. Pat. No. 5,376,403), which in turn is a continuation in part of Ser. No. 07/477,678 filed on Feb. 9, 1990, now abandoned.

BACKGROUND OF THE INVENTION

The present invention relates to substrates for use in the preparation of printed circuits and the like. In particular, the present invention is directed to substrate materials for use in the preparation of electrical circuits comprising conductive inks of the type disclosed, for example, in co-pending U.S. application Ser. No. 07/769,892, now U.S. Pat. No. 5,376,403.

Printed circuits are typically prepared by adhering conductive traces which form an electrical interconnect pattern onto a suitable substrate. Commonly-employed substrate materials have included epoxy-glass laminate, paper-phenolic laminate, polyimide-glass laminate, flexible polyimide films, and injection molded plastics such as liquid crystal polymers and Ryton® (available from Phillips 66, Bartlesville, Okla.). Copper foil has most successfully been used to form conductive traces on these substrates, in particular because of its high electrical conductivity and the strong bond formed when the copper foil is laminated to the substrates.

More recently, electrically conductive ink compositions have been developed for use in preparing conductive traces. As such conductive ink compositions may be applied using various printing techniques which offer significant advantages in economy and efficiency, considerable attention has been devoted to various formulations. In many cases, however, the conductive ink compositions heretofore developed have not exhibited adequate adhesion to the more commonly-employed substrate materials noted above, and thus printed circuits prepared using the known conductive ink compositions have not exhibited adequate reliability or durability for many uses.

Co-pending U.S. patent application Ser. No. 07/769,892 filed Oct. 1, 1991, now U.S. Pat. No. 5,376,403, the entire disclosure of which is hereby incorporated by reference, describes electrically conductive compositions comprising a solder powder, a chemically protected cross-linking agent with fluxing properties, and a reactive monomer or polymer. Such compositions including in addition a high melting metal powder (for example, copper) and optionally a resin are particularly suitable for use as conductive inks for preparation of printed circuits. While the compositions of U.S. Pat. No. 5,376,403 provide bulk electrical conductivities approaching that of solid copper and highly corrosion resistant final products with resistance to degradation at high temperatures and relative humidities, some of these compositions also do not exhibit entirely adequate adhesion properties when applied to many of the traditional substrate materials. As the above-noted substrate materials have highly desirable mechanical and electrical properties (in particular, high strength, light weight, good high temperature stability and flexibility) which are important for preparation of useful printed circuits and are of a relatively low cost, it would be highly advantageous if substrates comprising these materials could be employed in combination with conductive ink compositions.

Accordingly, it is an object of the present invention to provide novel substrate materials which exhibit both the desirable bulk properties of conventional substrates and surface properties suitable for formation of strong adhesive bonds with conductive ink compositions.

SUMMARY OF THE INVENTION

In accordance with the present invention, there are provided novel substrates for printed circuit boards and the like comprising a substrate base layer having specific bulk properties and at least one adherent layer fixedly attached thereto. Pursuant to one embodiment of the invention, the adherent layer preferably comprises a thermoplastic material having a glass transition temperature in the range of about 355° and about 473° F. (about 180° to about 245° C.). Pursuant to another embodiment of the invention, the adherent layer comprises a thermosetting material capable of B-stage curing. Methods for the preparation of the novel substrates and printed circuit boards comprising the novel substrates and conductive traces formed with electrically-conductive ink compositions are also disclosed.

DETAILED DESCRIPTION OF THE INVENTION

Pursuant to the present invention, substrates having ideal surface properties for use in preparation of printed circuits and the like using conductive ink compositions (such as, for example, those disclosed in U.S. Pat. No. 5,376,403) are provided by forming a composite substrate material including at least one adherent layer. The thickness of the adherent layer may be varied over a fairly broad range. Typically, a layer of a minimum thickness of at least about 0.0001 inch (0.00254 mm) is employed to provide a smooth surface for bonding with the electrically conductive composition. As the surface properties of the adherent layer are critical, a suitable maximum thickness for the adherent layer is determined largely by consideration of the bulk properties of the composite substrate; for example, thicker adherent layers may be employed with substrate base layers or with particular types of substrates. With appropriate substrate base layers, the thickness of the adherent layer may be up to about 0.01 inch (0.254 mm). A preferred range for the thickness of the adherent layer is 0.0001 inch (0.00254 nun) to 0.003 inch (0.0762 mm).

Pursuant to one embodiment of the invention, the adherent layer comprises a thermoplastic material. To be particularly suitable for use with electrically conductive ink compositions, a thermoplastic material for formation of the adherent layer should have a glass transition temperature within the range of about 180° and about 245° C. An adherent comprising a material having a glass transition temperature substantially outside this range would not be expected to exhibit improved adhesion with most electrically conductive ink compositions. Most preferably, the thermoplastic material is selected from the group consisting of polyetherimides, polyethersulfones and polyarylsulfones. Other thermoplastic materials having a glass transition temperature in the range of about 180° and about 245° C. and otherwise exhibiting properties generally consistent with the descriptive criteria recited in Table 1 are also contemplated as suitable for use in accordance with the present invention. Preferably, a thermoplastic material used for preparation of the adherent layer would meet many, if not all, of the descriptive criteria specified below in Table 1.

TABLE 1

| Property | Test Method | Qualifying Value |
|---|---|---|
| Mechanical | | |
| Ultimate Tensile Strength | ASTM D638 | >5,000 psi (>34.5 MPa) |
| Tensile Modulus | ASTM D638 | >200,000 psi (>1379 MPa) |
| Tensile Elongation | ASTM D638 | 2–150% |
| Izod Impact Strength | ASTM D256 | >5 ft lbs/in (>250 J/m) |
| Thermal | | |
| Thermal Expansion | ASTM D696 | <10 × 10$^{-5}$ in/in °F. (<18 × 10$^{-5}$ m/m °C.) |
| Glass Transition Temp. | DSC* | 356–473° F. (180–245° C.) |
| Heat Deflection Temp. | ASTM D648 | 338–482° F. (170–250° C.) |
| Electrical | | |
| Dielectric Strength | ASTM D149 | >250 V/mil |
| Dielectric Constant | ASTM D150 | 2–5 |
| Volume Resistivity | ASTM D257 | >1 × 10$^{10}$ ohm-cm |
| Surface Resistivity | ASTM D257 | >1 × 10$^{9}$ ohm/square |

*Dynamic Scanning Calorimetry, used for measuring thermodynamic changes of a material, such as melting point or glass transition temperature Polyarylsulfones are a known class of materials having a structure based upon the repeating unit

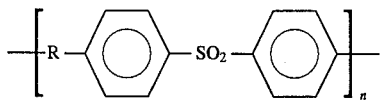

in which R is an aryl group. An exemplary polyarylsulfone of this type is Radel® A-300, available from Amoco. Atlanta, Ga. The material is transparent and is described as offering high heat deflection temperature, thermal stability for extended use, excellent toughness and creep resistance, resistance to steam and boiling water, and good stress crack resistance. This product is reported to have the following properties: tensile strength—12,000 psi (82.7 MPa); tensile modulus—385,000 psi (2655 MPa); Izod impact strength—160 ft lbs/in (8,000 J/m); thermal expansion—2.7 ×10$^{-5}$ in/in ° F. (4.9×10$^{-5}$ m/m ° C.); heat deflection temperature—399° F. (204° C.); dielectric strength (V/rail) –383; dielectric constant –3.51; volume resistivity. (ohm cm) –7.71×10$^{17}$; surface resistivity. (ohm/square) –2.1×10$^{16}$.

Polyethersulfones are another known class of materials having a structure based upon the repeating unit

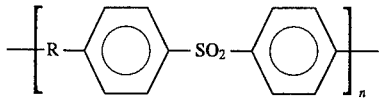

wherein R is a direct bond, an aryl group or an alkyl group. One exemplary polyethersulfone for use in accordance with the present invention is Ultrason® E, available from BASF Corporation. Parsippany, N.J. This material is an amorphous, thermoplastic polycondensation product, the fundamental structure of which consists predominantly of the following blocks:

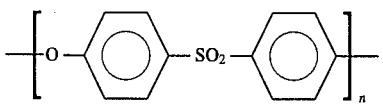

The material is described as having excellent dimensional stability, high strength, high rigidity and good ductility at temperatures up to the vicinity of the glass transition. This product is reported to have the following properties: tensile strength—15,500 psi (106 MPa); tensile modulus—580,000 psi (4,000 MPa); thermal expansion—6×10$^{-5}$ in/in ° F. (10.5×10$^{-5}$ m/m ° C.); heat deflection temperature—430° F. (221° C.); dielectric constant—3.10.

Polyetherimides constitute yet another class of materials known in the art. A typical structure for members of this class includes the following type of repeating structure

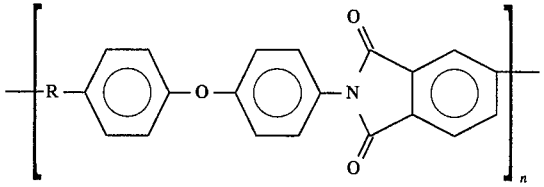

wherein R is an aryl group or an alkyl group. Exemplary polyetherimides include Ultem® 1000 and Ultem® CRS5001, available from General Electric Corporation, Pittsfield, Mass. These materials are described as high performance thermoplastic polyetherimide materials exhibiting high temperature resistance, low moisture absorption and excellent dielectric properties. Ultem® 1000 is reported to have the following properties: tensile strength—15,200 psi (105 MPa); tensile modulus—430,000 psi (2965 MPa); tensile elongation (%)—60; Izod impact strength—25 ft lbs/in (1250 J/m); thermal expansion—3.1×10$^{-5}$ in/in ° F. (5.6×10$^{-5}$ m/m ° C.); glass transition temperature—426° F. (219° C.); heat deflection temperature—410° F. (210° C.); dielectric strength (V/rail)—830; dielectric constant—3.15; volume resistivity (ohm-cm)—6.7×10$^{17}$; surface resistivity (ohm/square)—1.8×10$^{16}$. Ultem® CRS5001 is reported to have the following properties: tensile strength—15,900 psi (110 MPa); tensile modulus—382,200 psi (2635 MPa); tensile elongation (%)—105; glass transition temperature—437° F. (225° C.); heat deflection temperature—441° F. (227° C.); C); dielectric strength (V/rail)—6200; dielectric constant—3.05; volume resistivity (ohm-cm)—4.3×10$^{17}$; surface resistivity (ohm/square)—1.1×10$^{16}$.

Pursuant to another embodiment of the invention, the at least one adherent layer comprises an epoxy., a phenolic, a cresolic, or other type of thermoset material (e.g., acrylates, cyanate esters, etc.) capable of B-stage curing. To be particularly suitable for use in accordance with the present invention, the thermosetting material should have a B-stage cured glass transition temperature ($T_g$) or melting point ($T_m$) between ambient temperature and about 473° F. (245° C). A B-stage cured thermoset having thermal properties outside this range, or any thermosetting material not capable of B-stage curing, would not be expected to exhibit improved adhesion with most electrically conductive ink compositions. Upon full thermal cure, these thermoset materials should exhibit many, if not all, properties generally consistent with the descriptive criteria recited in Table 1.

A B-stage resin is a thermosetting type resin which has been thermally treated beyond the A-stage (monomer stage) so that the product has only partial solubility in common solvents (alcohols, ketones, etc.). Preparation of the B-stage material may involve a simple drying or solvent removal step; alternatively, a partial reaction of the resin and curing agent may take place to form a product with some physical integrity and chemical/environmental resistance. For purposes of the present invention, a material having a B-stage cured thermal glass transition temperature and/or melting point below about 473° F. (245° C.) would be suitable for preparation of the adherent layer. The electrically conductive ink is applied to the B-stage cured material; after application of the ink (and generally, upon curing of the ink), the B-staged thermoset is fully cured.

Epoxies based upon aromatic diglycidyl ethers are a known class of materials having a structure derived from the following precursor (wherein M=hydrogen, halogen, aryl or alkyl, and R and R' are independently selected from hydrogen, halogen, aryl and alkyl):

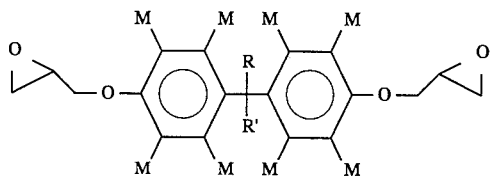

These materials typically exhibit B-stage cured thermal characteristics consistent with the requirements for this invention, and upon full thermal cure exhibit properties consistent with the descriptive criteria recited in Table 1. Exemplary epoxies of this type include EPON® 828, EPON® 1071, EPON® 1123-A-80, EPON® 1079, EPON® 1001, EPON® 825 and EPON® 826 (available from Shell Chemical Company, Houston, Tex.) and Mavidon 350CC (available from Mavidon Corporation, Palm City, Fla.).

EPON® 828 is a general aromatic diglycidyl ether type epoxy, wherein M is hydrogen and R and R' are methyl. The resin is described as having high chemical resistance to acids, bases, fuels, and solvents. It has the following reported properties: heat defection temperature—approximately 266° F. (130° C.), when cured with methyl tetrahydrophthalic anhydride (a recommended anhydride); tensile strength—>10,000 psi (69 MPa); tensile modulus—>400,000 psi (2750 MPa); volume resistivity. (ohm-cm)—1×10$^{16}$; dielectric constant—4.0.

EPON® 1071 is derived from N,N,N',N'''-tetraglycidyl-a, a'-bis(4-aminophenyl)-p-diisopropylbenzene of the following structure:

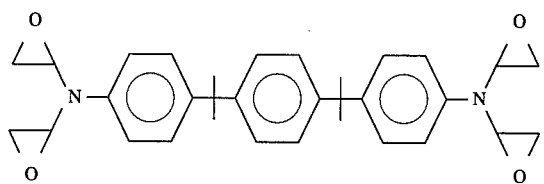

The resin is reported to have a B-stage cured melting point of 122° F. (50° C.) and B-stage cured glass transition of approximately 80°–95° F. (27°–35° C.). The ultimate glass transition temperature is reported as approximately 414° C. (212° C.). The following additional properties are reported: tensile strength—19,000 psi (131 MPa); tensile modulus—460,000 psi (3172 MPa); tensile elongation (%)—1.9; dielectric strength (V/rail)—611; dielectric constant—3.36; volume resistivity (Ohm-cm)—3.05×10$^8$.

EPON® 1123-A-80 is derived from the general aromatic diglycidyl ether structure wherein M is Br and R and R' are methyl. The fully-cured material has a glass transition temperature of 284° F. (140° C.). The following additional properties are reported for the fully-cured material: dielectric constant—4.7; dielectric strength (V/mil)—800; volume resistivity (ohm-cm)—4×10$^{13}$.

EPON® 1079 is derived from diglycidyl-9,9'- bis(4-hydroxyphenyl)fluorene of the following structure:

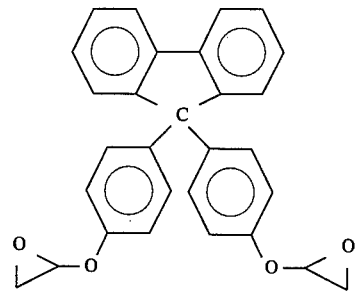

The material has a B-stage cured melting point of 178° F. (81° C.), and a glass transition temperature of 118° F. (48° C.). The fully-cured material has a glass transition temperature of approximately 500° F. (260° C.), a tensile strength of approximately 18,000 psi (124 MPa), and tensile modulus of approximately 485,000 psi (3,344 MPa).

EPON® 1001 is based upon an epoxide of the following structure:

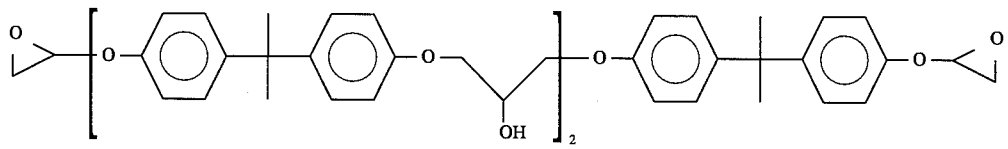

The product has a B-stage cured melting point of approximately 172° F. (78° C.).

EPON® 825 and EPON® 826 are both based upon aromatic diglycidyl ethers wherein M is hydrogen and R and R' are methyl. EPON® 825 has a slightly higher purity than EPON® 826. EPON® 825 has a B-stage cured melting temperature of approximately 122° F. (50° C.).

Mavidon 350CC is a general aromatic diglycidyl ether epoxy. The resin, when B-stage cured at 60° C. for approximately 15 minutes, exhibits a melting temperature of approximately 90° C. Upon full cure, this resin exhibits a glass transition temperature of approximately 356° F. (180° C.). The cured film has a dielectric constant of 3.1 and a volume resistivity of $4 \times 10^{14}$ ohm-cm.

Phenolic and cresolic resins are another known class of materials that typically exhibit suitable B-stage cured thermal characteristics and properties upon full thermal cure consistent with the descriptive criteria recited in Table 1. These materials have the general structure

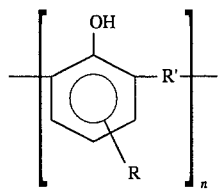

wherein R is H or alkyl, such as $CH_3$, and R' is a direct bond, aryl or alkyl. Exemplary, phenolic and cresolic-type materials for use as adherent layers include Durite™ SD-392A, Durite™ SD1731, Durite™ SD333A and Durite™ SD1621 resins (all available from Borden Industrial Products, Louisville, Ky.).

Durite™ SD-392A is a para-tertiary butyl novolac of the following structure:

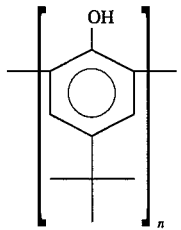

Durite™ SD1731, Durite™ SD333A and Durite™ SD1621 differ in molecular weight, but all have the general structure:

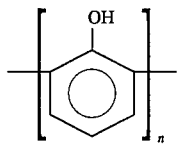

All four products exhibit B-stage cured melting temperatures below 212° F. (100° C.).

Reinforced or filled versions of these thermoset materials may be used. Woven glass, woven aramid or other woven fiber, as well as mineral and short glass fillers, may be incorporated into these resins at any content level prior to B-stage curing so long as the general thermal and physical requirements for the material are met.

In accordance with the present invention, the at least one adherent layer is applied to a substrate base material, which is chosen primarily for its contribution to the bulk properties of the composite substrate. The substrate layer should exhibit dimensional stability such that under processing or operating conditions, there is no more than one-half of one percent change of any dimension. Processing temperatures include: the application and cure of the electrically conducting ink, which for most applications would be on the order of about 392° to about 446° F. (200° to 230° C.) for 30 seconds to 1 hour; a possible post-bake, for example at about 212° F. (100° C.) for 1 to 12 hours; and the bonding of the adherent layer to the substrate, which, depending upon the materials involved, may range from ambient temperature to about 446°–482° F. (230°–250° C.). Operating temperatures (the temperatures at which the composite substrates are used) are expected to be less severe that the processing temperatures; however, the substrates must be capable of withstanding the operating temperatures over their lifetimes. The substrate should also exhibit chemical stability, whereby no chemical changes occur in the substrate under operating or processing conditions (e.g., oxidation or humidity) such that there is a degradation of the thermal or physical properties. In addition, the substrate should exhibit adequate chemical resistance to compositions with which it is likely to come into contact, such as solvents, acids and bases. A typical test for chemical resistance is a 10–100 day immersion at room or elevated temperature in the chemical to be tested, followed by a tensile strength test according to ASTM D882 for comparison to untreated samples; a satisfactory material will exhibit less than about 10% degradation of tensile strength according to ASTM D882 with respect to the following materials: water from pH 4 through pH 10; weak acids, such as glacial acetic acid; weak bases, such as 10% NaOH in water; and typical solvents, such as acetone and methanol. A suitable substrate base material would also exhibit an Izod Impact Strength tested according to ASTM D 256 greater than 1 ft-lbs/in. Any substrate that meets the requirements of the industry-wide standard Mil-Specification MIL-P-13949 [*Military Specification, Plastic Sheet, Laminated, Metal Clad (For Printed Wiring Boards), General Specifications For*, issued as MIL-P-13949G on 11 Feb. 1987 Superseding MIL-P-13949F of 10 Mar. 1981] would clearly be suitable for use as the base layer. Furthermore, materials which exhibit the characteristics reported in Table 2 would in general be suitable for use as the base layer.

TABLE 2

| Property | Test Method | Qualifying Value |
|---|---|---|
| Mechanical | | |
| Ultimate Tensile Strength | ASTM D638 | >10,000 psi (>69 MPa) |
| Tensile Modulus | ASTM D638 | >250,000 psi (>1725 MPa) |
| Thermal | | |
| Glass Transition Temp. | DSC | >212° F. (>100° C.) |
| Heat Deflection Temp. | ASTM D648 | >212° F. (>100° C.) |

For purposes of the present invention, particularly suitable substrate base layers would exhibit the following properties: Izod impact strength of >1 ft lb/in (>50 J/m); dimensional stability under operating and process temperatures (0.5% change); no significant change in physical or thermal properties upon exposure to operating and processing conditions, and preferably no change; and 10% degradation upon exposure to water from pH 4 through pH 10, weak acids, weak bases, and typical solvents.

A wide variety of substrate base materials may be employed, depending upon the properties desired for the composite material. Suitable substrates for use with both thermoplastic and thermoset adherent layers include the following known substrate materials: epoxy-glass laminates (examples of which include G10 or FR-4 laminate); paper-phenolic laminates (made from kraft paper impregnated with phenolic resin); polyimide-glass laminates (made from polyimide-impregnated glass laminate); flexible polyimide films (such as Kapton® from DuPont Co., Wilmington, Del. or Upilex® from ICI, Wilmington, Del.); liquid crystal polymers (such as Vectra® from Hoechst-Celanese Corp., Chatham, N.J.); and polyphenylenesulfide (available as Ryton® from Phillips 66).

Polyimides are a broad class of materials containing a characteristic heterocyclic structure (or derivative thereof) as a recurring unit. One typical repeating structure found in polyimides is

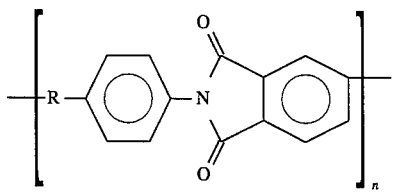

wherein R is an alkyl or aryl group. One suitable polyimide for use in accordance with the present invention is Kapton® from DuPont Electronics, Wilmington, Del. This material has the structure

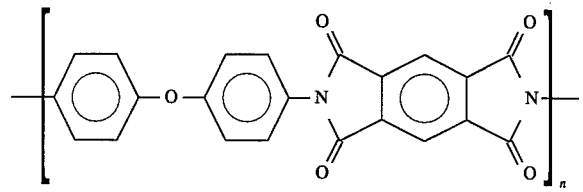

which represents a ODA-PMDA polyimide (i.e., the condensation product of oxydianaline and pyromellitic dianhydride). It is described as a strong, transparent amber-colored material exhibiting excellent properties over an extremely wide temperature range. This product is reported to have the following properties: tensile strength—33,500 psi (231 MPa); tensile modulus—370,000 psi (2550 MPa); tensile elongation (%)—72; Izod impact strength—8 ft lbs/in (400 J/m); glass transition temperature—680° F. (360° C.); dielectric strength (V/mil)—7,700; dielectric constant—3.4; volume resistivity (ohm-era)—$1.5 \times 10^{17}$; surface resistivity (ohm/square)—$0.4 \times 10^{16}$. Another suitable polyimide is Upilex® available from ICI Films, Wilmington, Del. It has the structure

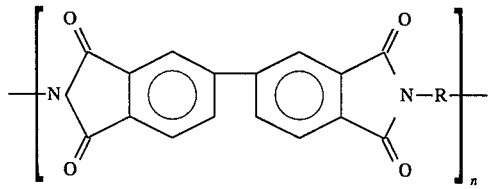

This product is reported to have the following properties: tensile strength—70,968 psi (489 MPa); tensile modulus—1,280,000 psi (8826 MPa); tensile elongation (%)—30; thermal expansion—$0.4 \times 10^{-5}$ in/in ° F. ($0.7 \times 10^{-5}$ m/m ° C.); glass transition temperature>932° F. (>500° C.); dielectric strength (V/mil)—6,800; dielectric constant—3.5: volume resistivity. (ohm-cm)—$1.0 \times 10^{17}$; surface resistivity. (ohm/square)—$0.3 \times 10^{16}$. These materials may be used to form flexible polyimide film base layers.

Liquid crystal polymers are an art-recognized class of high-molecular weight materials distinguished primarily by their tendency to develop large scale intradomain orientation spontaneously in melt or solution. This orientational tendency may be exploited during processing to generate bulk structures exhibiting anisotropic material properties over large scales [see, e.g., G. C. Rutledge, "Modeling Chain Rigidity and Orientation in Liquid Crystalline Polymers," *Polymer Preprints* 33(1):537 (1992)]. Examples of liquid crystal polymers include materials from the classes of polyesters, polyethers and polyamides. Vectra® liquid crystal polymer is a wholly aromatic polyester thermoplastic having the following reported properties: tensile strength—30,000 psi (207 MPa); tensile modulus—2,400,000 psi (16,600 MPa); tensile elongation (%)—2.2; Izod impact strength—40 ft lbs/in (2,000 J/m); thermal expansion—$0.28 \times 10^{-5}$ in/in ° F. ($0.5 \times 10^{-5}$ m/m ° C.); heat deflection temperature—489° F. (254° C.); dielectric strength (V/mil)—1,100; dielectric constant—4.1; volume resistivity. (ohm-cm)—$1 \times 10^{15}$.

Ryton® R-4 polyphenylene sulfide has the following reported properties: tensile strength—22,500 psi (155 MPa); tensile elongation (%)—0.9; Izod impact strength—5.7 ft lbs/in (285 J/m); thermal expansion—$1.11 \times 10^{-5}$ in/in ° F. ($2.0 \times 10^{-5}$ m/m ° C.); heat deflection temperature—>500° F. (>260° C.); dielectric strength (V/mil)—450; dielectric constant—3.8; volume resistivity (ohm cm)—$1 \times 10^{16}$.

Phenolic and cresolic resins as previously described are used to form paper-phenolic laminates for use as substrate base layers in accordance with the present invention. Exemplary phenolics or cresolics for this purpose include those materials previously identified as suitable for use in formation of the at least one adherent layer.

Polymers derived from bisphenol-A diglycidyl ether as previously described are also useful resins in the formulation of epoxy-glass laminates. Exemplary products derived from bisphenol-A diglycidyl ether include FR-4 and G10, available from General Electric, Coshockton, Ohio. FR-4 epoxy is reported to have the following properties: Izod impact strength—11 ft lbs/in (550 J/m); thermal expansion—$4.6 \times 10^{-5}$ in/in ° F. ($8.3 \times 10^{-5}$ m/m ° C.); glass transition temperature—275° F. (135° C.); dielectric constant—4.2; volume resistivity (ohm cm)—$5.0 \times 10^{12}$; surface resistivity (ohm/square)—$1.3 \times 10^{11}$.

In addition, a variety of metal substrate base materials may be employed with either type of adherent layer in accordance with the present invention, including but not limited to aluminum, steel, invar and copper. Although metals are not generally employed as substrates for printed circuit boards and the like because they would short out any circuitry applied thereto, an adherent layer in accordance with the present invention serves to insulate the conductive traces from the underlying substrate base material. The superior heat dissipating properties of metal substrate base materials are highly desirable in many applications. The rigidity of metal substrate base materials, moreover, generally is substantially greater than that of polymeric substrates of comparable thickness. Thus, composite substrates comprising metal base layers are particularly desirable for production of circuitry which may withstand substantially higher electrical currents than similar circuitry produced on conventional polymeric substrates. The metals suitable for use as base layers have substantially the same mechanical properties as the other materials previously described for this use and comparable thermal properties, with the exception of glass transition temperature and heat deflection temperature (which do not apply to metals). Rather, a metal suitable for use in accordance with the present invention has a melting point>250° C.

The range of suitable thicknesses for the substrate base layer is determined primarily by the desired bulk properties for the composite substrate material; in addition, as previously noted the relative thicknesses of the substrate base layer and adherent layer(s) are important for provision of a suitable material. With particular materials, a substrate base layer of a thickness of about 0.0005 inch (0.0127 mm) may be sufficient to provide a product with adequate properties. For other uses, substrate base layers of thicknesses up to about 1 inch (25.4 cm) would be suitable. Typically, substrate base layers having a thickness in the range of about 0.0005 inch (0.0127 mm) to about 0.1 inch (2.54 mm), and preferably about 0.01 inch (0.254 mm) to about 0.08 inch (2.032 mm), are suitable for use in accordance with the present invention.

A variety of techniques may be employed to prepare the composite substrates of the invention, including solution casting, hot roll laminating, hot vacuum pressing, vapor deposition, curtain coating and other known methods. The choice of a particular method for preparation of the composite substrate materials is determined largely by the nature of the adherent layer and substrate base materials, and a number of alternative methods are generally available for particular combinations of precursor materials.

When the substrate base material comprises a thermosetting resin (e.g., an epoxy), it is advantageous to prepare a B-stage resin prepreg in which the resin is cured at a low temperature to obtain dimensional integrity without cross-linking the resin; this renders the surface highly reactive. The prepreg is then hot-pressed into the adherent, which effectively bonds the adherent to the substrate, and simultaneously cross links the resin. Typically, this process is carried out at a temperature in the range of about 350°–375° F. (149°–191° C.), with application of pressure in the range of about 200–250 psi (1.38–1.72 MPa) applied for about 30–60 minutes. The exact conditions employed depend upon the specific materials employed and the size and thickness of both base and adherent. Optimal conditions may readily be determined empirically. In such a case, a flexible film of the thermoplastic (prepared, for example, by extrusion, blow molding or casting) is suitably employed.

For preparation of composite substrates using high temperature thermoplastic substrate base materials, such as liquid crystal polymers and flexible high temperature films such as polyimide, hot press or hot roll methods are particularly suitable for applying one or more thin layers of adherent to the substrate base. In these methods, high temperature and high pressure are combined to bond the thin adherent layer to the substrate. Typically, this process is carried out at a temperature in the range of about 350°–375° F. (149°–191° C.), with application of pressure in the range of about 200–250 psi (1.38–1.72 MPa) applied for about 30–60 minutes. The exact conditions employed depend upon the specific materials employed and the size and thickness of both base and adherent. Optimal conditions may readily be determined empirically. Bonding of the adherent to the substrate may be promoted by first applying a thin layer of solvent, such as dichloromethane or N-methylpyrrolidone, over the surface of the adherent layer with which the substrate will come into contact; in this manner, the surface is partially dissolved and bonding is activated.

A method of providing the adherent surface which has general applicability to all types of substrate base layers calls for spraying, painting or curtain coating (a controlled flow application process) a solution of the desired adherent in a suitable solvent onto the substrate base layer. The concentration of the solution employed depends on the concentration necessary for application. In spray coating, a very low viscosity solution is necessary; thus, a typical solution may consist of 5–10% by weight adherent dissolved in methylene chloride or trichloroethane. For curtain coating, on the other hand, a high viscosity solution is required; thus, a typical solution may consist of 40–60% by weight adherent in N-methyl pyrrolidone. Suitable solvents for this purpose include N-methyl pyrrolidone and dichloromethane.

For formation of thermoset adherent layers in particular, a variety of known methods may be employed, including but not limited to solution casting, curtain coating, dip coating, spray coating and screen printing. The choice of a particular method for preparation of the substrate is determined largely by the nature of the adherent layer, and a number of alternative methods are generally available for particular combinations of precursor materials. At the time of application of the electrically conductive ink, the adherent layer comprising a thermosetting material is still in the B-stage cured state. Only upon full cure of the ink does the adherent layer become fully cured. Prior to the final cure, the B-stage cured thermosetting material exhibits the desired surface properties for adhesion with the ink, resulting in an improved bonding. Thus, composite substrates wherein both the adherent layer and the base layer comprise thermosetting materials are contemplated; in such a case, the base layer is fully cured prior to formation of the adherent layer, which remains in the B-stage until after application of the ink.

The composite substrates of the present invention exhibit a combination of properties which make them ideally suited for use in preparation of printed circuit boards or the like. The composite material exhibits the superior surface properties such as adhesion and dielectric strength of the adherent layer, while substantially retaining the desired bulk properties (e.g., thermal and physical properties) of the substrate base material.

The substrates of the present invention are of particular utility for preparation of printed circuits and the like using inks based upon the conductive compositions disclosed in U.S. Pat. No. 5,376,403. In general terms, the electrically conductive adhesive compositions comprise two primary components: a low melting point metal or metal alloy powder and cross-linking agent mixture comprising a protected curing agent, which also acts as a primary fluxing agent. Depending upon the intended end use, the preferred compositions for use as conductive inks comprise the following:

(1) A high melting point metal or metal alloy powder;

(2) A low melting point metal or metal alloy powder (solder);

(3) Optionally, a resin;

(4) A cross-linking agent mixture comprising a protected curing agent, which also acts as a primary fluxing agent; and (5) Optionally, a reactive monomer or polymer which can be cross-linked by the curing agent (hereinafter referred to as the "monomer").

The compositions frequently also contain at least one solvent; they may also contain other additives to improve certain properties such as adhesion or solderability. The composition must either contain (3) and/or (5), or alternatively (3) and/or (5) may be combined with (4) into a single species, as in the case of a protected homopolymerizable resin. Preferably, components (3), (4) and/or (5) are halogenated.

In preparing the composition, the proportions of components (1)–(5) plus a solvent may be varied over a considerable range and still yield an electrically conductive material once cured. Measurable electrical conductivity can be achieved with component (1) comprising from 0–65% of the volume of the composition (0% being the case of a composition useful as a solder paste). Similarly, component (2) comprises from 6–65% by volume of the composition. Component (3) comprises from 0–45% of the composition by volume (0% being the case of a solder paste which requires no adhesive). Component (4) comprises 0.01–61% of the composition by volume. Component (5) comprises 0–50% of the composition by volume. Some of the compositions within these ranges exhibit some shrinkage and cracking or balling when cured; however, they remain useful as conductive adhesives in applications where these characteristics are harmless, such as in attaching components to electrical circuits.

Preferably, the composition after curing has a bulk electrical resistivity of less than $10^{-4}$ Ohm-cm. This electrical conductivity range can be satisfied by numerous formulations having components (1)–(5) within the following ranges:

Component (1): 0–38% of the volume of the composition (values near 0% being compositions useful as solder pastes);

Component (2): 6–37% by volume of the composition;

Component (3): 0–42% by volume (values near 0% being compositions useful as solder pastes);

Component (4): 7–60% by volume;

Component (5): 0–47% by volume.

Some of the compositions within these ranges may exhibit shrinkage and cracking or bailing when cured, but they remain useful as conductive adhesives in applications where these characteristics are harmless.

Most preferably, the composition has a bulk electrical resistivity of approximately $3 \times 10^{-5}$ ohm-cm or less. These characteristics can be satisfied by numerous formulations having components (1)–(5) within the following ranges:

Component (1): 13–38% of the volume of the composition (values near 13% being compositions useful as solder pastes);

Component (2): 6–29% by volume of the composition;

Component (3): 0–15% by volume (values near 0% being compositions useful as solder pastes);

Component (4): 30–52% by volume;

Component (5): 0–32% by volume.

While again some of the compositions within these ranges may exhibit shrinkage and cracking or bailing when cured, they remain useful as conductive adhesives in applications where these characteristics are harmless.

Typically, the high melting point metal powder (1) is copper powder; however, other metals such as silver, aluminum, gold, platinum, palladium, beryllium, rhodium, nickel, cobalt, iron, molybdenum and high-melting point alloys of these metals, may alternatively be employed. Preferably, the copper powder is spherical or nearly spherical as produced by gas atomization. Electrolytic powders or flakes, recommended in the prior art, are not desirable for several reasons. Irregularly-shaped powder particles tend to be sponge-like in morphology, increasing the oxidized surface area substantially as compared to spherical particles. Irregular particles are also more difficult to flux and wet with molten metal. They result in compositions having poorer electrical conductivity.

A spherical powder containing a wide distribution of particle sizes distributed approximately normally about an average particle diameter is preferred over monosized spheres. The wide distribution of sizes increases the density of the packed metal powder as compared to monosized spheres, improving electrical conductivity and mechanical integrity. The powder generally has an average particle diameter of 1 to 50 microns. The preferred powder has a mean particle diameter of 10–30 microns.

Most preferably, the powder is de-oxidized in a hydrogen oven at least at 300° C. for about 10 minutes prior to use. Removal of naturally-existing surface oxides from the copper particles has been shown to have a marked improvement in the resulting resistivity of the final cured composition.

The solder powder may be Sn, Bi, Pb, Cd, Zn, Ga, In, Te, Hg, Ti, Sb, Se, Po, or an alloy or other metal having a melting point lower than that of the metal powder in (1). Typically, the powder has a mean particle diameter of 1–40 microns; preferably, the average particle diameter is less than or equal to the average diameter of the high melting point metal particles and the particle size distribution is substantially the same as that of the high melting point metal powder. The principal requirement of the alloy is that it flow in the composition before the vitrification of the polymers in the composition. In order for this to occur, the solder alloy must readily wet copper. For this reason, alloys of tin are ideal. Preferably, the solder powder consists of Sn and Pb.

The resin functions principally to adhere the cured composition to the substrate, to provide chemical binding sites for the reaction products after curing, and to increase the cohesive strength of the cured composition. The resin also functions as a medium for delivering flux to the metal powder, as a thickening binder for the composition, and as a medium for increasing the glass transition temperature of the cured composition. In order for the composition to achieve the highest electrical conductivities, it must achieve and maintain low viscosity up to the temperature at which the solder powder melts and wets the copper powder. If the resin becomes too thick before the solder powder has melted, it will impede the flow of the melt and reduce the degree of metal powder soldering. For this reason, the curing of the resin must occur slowly relative to the time required to reach the melting point of the solder powder.

The resin (3) may be any resin which can be cross-linked by the curing agent, a metal catalyst, or a hydroxyl group-bearing agent. Resins which meet this requirement include but are not limited to epoxies, phenolics, novalacs (both phenolic and cresolic), polyurethanes, polyimides, bismaleimides, maleimides, cyanate esters, polyvinyl alcohols, polyesters, and polyureas. Other resin systems may be modified to be cross-linkable by the curing agent, a metal catalyst, or a hydroxyl group-bearing agent. Examples of such resins are acrylics, rubbers (butyl, nitrile, etc), polyamides, polyacrylates, polyethers, polysulfones, polyethylenes, polypropylenes, polysiloxanes, polyvinyl acetates/ polyvinyl esters, polyolefins, cyanoacrylates, and polystyrenes. Typically, any resin would function in this invention if the resin can be modified to contain at least one of the following functional groups: anhydrides, carboxylic acids, amides, imides, amines, alcohols/phenols, aldehydes/ ketones, nitro compounds, nitriles, carbamates, isocyanates, amino acids/peptides, thiols, sulfonamides, semicarbazones, oximes, hydrazones, cyanohydrins, ureas, phosphoric esters/ acids, thiophosphoric esters/acids, phosphonic esters/acids, phosphites, phosphonamides, sulfonic esters/acids or other functional groups known to one skilled in the art to act as reactive sites for polymerization. For example, a polyolefin would not be suitable as a resin in this invention, as it has no reactive sites for binding and has poor adhesive properties; however, a carboxylated polyolefin functions well when matched with a suitable cross-linking agent. A combination of these and other resins, such as non-cross-linkable thermoplastic resins, may also be used as component (3). Presently preferred is an epoxy resin, such as the reaction product of epichlorohydrin and bisphenol A, combined with a phenolic epoxy resin. Additional examples of specific resins suitable for use in the conductive ink formulations are found in U.S. Pat. No. 5,376,403.

The principal feature of the cross-linking agent is that in its unprotected form it acts as an acid or a strong base. Most acids and strong bases function well as fluxing agents, because they can remove oxides from metals. However, if they are left in their reactive form in the composition they would prematurely cross-link the resin or become used up in reactions with the metal powders. The principal property of a protected curing agent in this invention is that it remain largely unreactive until it is needed to flux the metal powder and cross-link the resin. Protection may be achieved by chemically binding the agent with a chemically- or thermally-triggered species so that it becomes reactive only at or near the time that the solder powder melts. Protection may also be achieved mechanically, for example by encapsulating the curing agent in a shell of non-reactive material which releases the curing agent only at or near the melting time of the solder powder.

Cross-linking agents (4) known in the art include anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, or other agents known to those skilled in the art to cure polymers and to be acidic or strongly basic. Protecting groups are generally specific to the curing agent employed and are not generally applicable to all curing agents. Typical protecting groups include carboxylic acids, amides, alcohols, alkyl halides, acid halides, thiols, ureas, alkyl silanes, diazoalkanes, and olefins. In addition, curing agents may be protected by formation of azomethanes, acetals, ketals, transition metal complexes, or other curing agent precursors. There exist many such protecting groups and complexes specific to the curing agents being protected.

A presently preferred cross-linking agent (4) comprises a mixture containing a mono- or polyanhydride. Phthalic anhydrides are preferred. It is of particular importance that the majority of the anhydride be protected from reacting with the resin (3) and metal powders (1) and (2) until the flow temperature of (2) is reached. This can be accomplished, for example, by chemically binding a protecting or inhibiting group on the anhydride. The protecting group is preferably selected so that the protected anhydride becomes reactive at elevated temperature. A method of protecting the anhydride is to esterify it with an alcohol or polyol to form the mono-ester acid and its derivatives, as described in U.S. Pat. No. 5,376,403. Butyl carbitol, methanol, ethylene glycol, glycerol, meso-erythritol, adonitol, and sorbitol are some examples of esterifying alcohols and polyols which can be employed. In addition, other protecting groups as are well known to those skilled in the art may also be employed. Additional examples of specific cross-linking agents suitable for use in the conductive ink compositions are found in U.S. Pat. No. 5,376,403.

Glycerol is a preferred esterifying polyol, producing a composition that achieves optimum electrical conductivity at moderate temperatures. The preferred anhydride ester is (2,3-dihydroxypropyl) hydrogen phthalate, which is suitably prepared by heating phthalic anhydride in glycerol at 356°–392° F. (180°–200° C.) in the presence of a trace of acid or water until the concentration of the mono-ester reaches equilibrium. The resulting mixture comprising anhydride, mono ester-mono acid, diacid and other reaction products may be directly employed as the cross-linking agent/flux in preferred compositions.

It is believed that the esterified anhydrides are chemically triggered at elevated temperatures and/or by interaction with the metal oxides. The anhydride and its protecting group are selected to chemically attack the oxides on the surface of the metal particles in an aggressive manner, yet remain non-reactive after curing. The metal oxides are apparently chemically immobilized in the resin system after curing, preventing them from forming caustic salts and acids. Furthermore, the aggressiveness of the cross-linking agent in attacking the metal oxides can be altered chemically, through selection of the cross-linking agent and its protecting group, and tailored to fit both the melting point of the solder (2) and the type of metal (1) to be fluxed.

The reactive monomer (5) functions to adhere the cured composition to the substrate, to provide chemical binding sites for the reaction products after curing, and to increase the cohesive strength of the cured composition. It also serves to slow the curing of the composition, thus maintaining a low-viscosity background medium during curing. The monomer also may function as a medium for delivering flux to the metal powder, as a thickening binder for the composition, and as a medium for decreasing the glass transition temperature of the cured composition if desired. When used with a resin (3), the monomer can slow the vitrification of the resin to allow good wetting of the metal powder (1) by the molten metal (2). It can also lower the glass transition temperature of the cured resin to promote post-cure soldering to the composition.

The monomer may be any species, monomeric or polymeric, which may be cross-linked by the curing agent, a metal catalyst, or a hydroxyl group-bearing agent. Generally, they are distinguished from resins by having relatively low molecular weights. The preferred reactive monomer (5) contains at least one —OH group, and preferably two or more —OH groups, as reactive site(s) for linking with cross-linking agents and the resin. The —OH groups in the monomer may also serve as antioxidants for the metals during the high temperature curing of the composition. A slightly acidic monomer is preferred. When used with an esterified anhydride curing agent, the acid tends to buffer the decomposition of the esterified anhydride, preserving it in its protected form until elevated curing temperatures are reached. The acid also acts as a preservative for the metal powders, keeping them from oxidizing through hydrolysis, thus extending the shelf life of the uncured composition. A preferred reactive monomer is bisphenol A.

Halogenation of components (3)–(5) is preferred in some cases in order to increase their reactivities in the composition. A halogenated resin (3) may be produced, for example, by reacting tetrabromobisphenol A with epichlorohydrin. Such resins, an example of which is commercially available from Shell Chemical Company, Anaheim, Calif. as Shell EPON® 1123-A80, have been found to enhance the conductivity of the cured composition. EPON® 1123-A80 is provided in the form of an 80±1% by weight solids solution in acetone having the following properties: a viscosity of 8–18 poise; an epoxide equivalent weight of 420–445; and a bromine content of 18–21% by weight. Additional information concerning the EPON® series of resins is available from Shell Chemical Company; additional information concerning the DOW DEN- and DER-series resins is available from Dow Chemical Company, Midland, Mich. Of course, these commercially-available resins are merely illustrative of epoxy and epoxy-novolac resins which may advantageously be employed.

Halogenation of the anhydride ester produces a more reactive anhydride and more stable esters. As a preferred embodiment, bromination has been found to enhance the fluxing action of the curing agent, (2,3-dihydroxypropyl) hydrogen tetrabromophthalate. Halogenation of the reactive monomer can also serve to increase its acidity and therefore enhance the properties previously described. A preferred halogenated monomer (5) is tetrabromobisphenol A. Halogenation of all constituents, however, may be detrimental to resistivity. The preferred formulation involves halogenation of the resin, and either the monomer or the anhydride ester.

After curing, soldering electronic components to the composition is observed to be possible with certain formulations. The conductor (metal powders) in the cured composition is covered with a thin layer of cured resin. It is believed that the ability of molten solder to wet the cured composition depends on the tenacity of the bond between the metal powders and the surrounding cross-linked polymer. Wetting of the conductor by additional molten solder is then possible if the polymer can be displaced from the molten solder during soldering operations.

The ability of molten solder to wet the cured composition is apparently affected by the bond strength between the metal and the cross-linked polymer. It is believed that the anhydride preferentially attaches itself to the metal surfaces during curing, forming an interfacial layer between the metal and the resin. The strength of bonding between this interfacial layer and the underlying cross-linked polymer may determine how easily molten solder can penetrate to coat the surfaces of the metal conductor in the composition after curing. It is believed that anhydrides which retain free cross-linking sites for the polymer even when attached to the surface of the metal, such as hexafluoroisopropyl-diphthalic anhydride, tend to cross-link with the resin. Thus, they form strongly bonded interfacial layers creating very tenacious interfacial films. Such anhydrides have been observed to exhibit poor solder wetting properties when employed in these compositions. Weakly bonded anhydrides, such as phthalic anhydride, probably form weakly bonded interfacial layers. Subsequently, they have exhibited excellent wetting by molten solder.

The electrically conductive adhesive compositions particularly suitable for use with the composite substrates of the present invention are suitably obtained by first preparing the cross-linking agent. Typically, the cross-linking agent is prepared by combining a 1:4 molar ratio of the anhydride with glycerol (or other protecting molecule). This mixture is heated while being mechanically stirred to 180° C. under nitrogen to effect esterification. The completeness of this reaction may be followed by using infrared spectroscopy. A sharp singlet band at 1800 cm$^{-1}$ will disappear as the reaction proceeds and be replaced with a broad singlet band at approximately 1740–1750 cm$^{-1}$. The esterification of tetrabromophthalic anhydride with glycerol is complete in approximately 2–4 hours under these conditions.

Finally, a solution of the resin is prepared in the desired solvent, if needed. A solution of the resin can be made by dissolving it in the desired solvent and boiling off the original manufacturer's solvent, usually acetone or methyl ethyl ketone (MEK). Ideally, where butyl carbitol is the chosen solvent for EPON® 1123-A-80 resin, the solution at completion consists of 80% by weight resin. Reactive monomer or polymer may also be added, either to this solution or as a separate solution.

The solutions are now intermixed at room temperature to produce a thin resinous mixture. Since the metal powder may take part in the polymerization reaction with this resin system, and since some of the reactants will be consumed in removing the oxide from the metal powder, it is necessary to determine the ideal stoichiometry for a given set of reactants empirically through measurements of resistivity, adhesion strength, and solderability of the final cured composition as a function of concentration of each component.

Next, the metal powder and solder powder are mixed in the desired proportions as indicated above. The metal powder mixture is then blended with the resinous mixture to produce a thick composition. Additional solvent may be added to achieve the desired viscosity.

To make a printed circuit using this composition, the substrate should preferably first be degreased and dried near 212° F. (100° C.) for at least 8 hours to expel any absorbed moisture. The composition is applied to the substrate in the desired pattern of a printed circuit. In a preferred approach, the composition is screen-printed onto the substrate which is then heated. As noted previously, the heating temperature should be selected with consideration for the curing temperature of the resin and the temperature range within which the solder powder melts.

Ideally, heating is done in a stepped temperature oven. First, the printed substrate is warmed to a temperature below the cure temperature of the ink to evaporate the solvent. When completely dry of the solvent, the temperature should be rapidly raised to the melting point of the solder (2). At or near this temperature, if the reactants have been properly selected and compounded, the cross-linking agent is activated to react with the metal powder and remove the oxides. Also at this temperature, the reactive monomer reacts with the cross-linking agent and the metal oxide so that the net result is a rapid de-oxidation of the metal particles, a wetting of the oxide free surfaces of the metal particles by the now molten solder, and the beginning of vitrification of the resin surrounding the metal particles. These reactions take only a few seconds.

Subsequently, the oven temperature is maintained at the cure temperature of the epoxy to fully harden the system. The entire reaction can occur in from as little as 10 seconds to as much as several minutes depending on temperatures and concentrations chosen. Post cure heating below this same temperature for several hours may be necessary to achieve final cure of the composition and optimal adhesion, depending on the resin and curing agent and resin employed.

The printed circuits obtained using this composition as described demonstrate excellent conductivity, and adhesion to the substrate. They do not lose conductivity, over time, and they can be soldered easily. Nor do they corrode in humid environments.

Some solderable compositions prepared as above may have a tendency to delaminate and fall apart upon heating with a soldering iron. To reduce this tendency and improve the soldering reworkability of the cured conductive ink, one may add a third metal or metal alloy powder incorporating high melting point metals which readily dissolve in (2). These additives, typically containing Ni, Ag or other elements to form solid solutions with (2), raise the melting point of the composition subsequent to cure. Upon application of heat during curing, soldering components to the cured ink, or during desoldering or rework of the ink, the additives dissolve into (2) and increase the melting temperature of the metal mixture. The result is that the composition resists melting at common soldering temperatures. This effect is achieved by the dissolving metal raising the melting point of the solder, the more the additive dissolves into the solder, the higher it raises its melting point until the additive is fully dissolved. Thus, a liquid phase is produced which resolidifies as the additive dissolves, even at temperatures above the initial melt point of the composition's solder.

When Ni is used as the additive, the preferred concentration of additive is from 1 to 10 weight percent of the total metal content of the composition. Higher concentrations tend to reduce the conductivity of the final cured ink undesirably. Also preferred is a thin coating of Ag over the Ni particles to promote its dissolving in the solder. Typically these metal powder additives have an average particle diameter below 20 micrometers. Smaller diameters dissolve faster by providing more surface area.

Additives to enhance the properties of these compositions to meet specific requirements may also be employed. Adhesion promoting agents, wetting agents, and viscosity modifiers are only a few of the additives which may be used at low levels to improve properties without significantly altering the conductivity of the material. Non-ionic surfactants, such as Surfadone LP Nonionic Surfactants available from GAF Chemicals Corporation, Wayne, N.J., have been used at levels between 0.1 weight percent and 1.0 weight percent to increase wetting of the ink and to increase adhesion. The Surfadone LP-100 and LP-300 surfactants are N-alkyl pyrrolidones in which the N-substituents contain 8 and 12 carbon atoms, respectively. These surfactants increased adhesion by as much as 40%. Rubber modified resin systems or other toughening agents may be used to increase the composition's toughness. Products such as DOW's experimental rubber modified epoxy XU71790.041 has been shown to increase the film's toughness. A variety of flexibilizing agents may also be added to these formulations to increase the material's flexibility. Flexible resins such as Shell's EPON® 872-X-75 or DOW's DER-736 can be used to increase flexibility of the cured product.

One method for creating a printed circuit using the conductive ink compositions of U.S. Pat. No. 5,376,403 and the composite substrates of the present invention comprises first making a printing screen or stencil containing the pattern of the desired printed circuit. The processes and apparatus for screen printing and stencil printing are well known to those skilled in the art. The screen is then used in a screen printing apparatus to print multiple copies of the printed circuit on the substrates selected.

After printing the uncured composition in the pattern of the desired printed circuit on the substrate, the composition is then cured by application of heat. A static oven may be employed, but a conveyorized oven with multiple heating stages is preferred. The conveyorized oven's heating method may be infra-red lamps, panel heaters, convection, forced hot air, induction, microwave, or other known heating method. Such ovens are well known to those skilled in the art. The multiple heating stages may then be used to heat, dry, cure, and then cool the composition in a controlled way, minimizing pinholes caused by outgassing, eliminating damage due to severe temperature changes, and achieving complete curing. Holes may be drilled or punched in the printed circuit thus obtained, as in a conventional circuit board. Components may be soldered to the printed circuit with a solder wave, soldering iron, hot air gun, or solder paste reflow, all common techniques well known in the art. Alternatively, components may be adhered to the printed circuit using the composition itself. This is accomplished, for example, by placing the components in the composition prior to curing. This has the advantage of eliminating the soldering operation and subsequent solder flux cleaning operations entirely. Yet another method for adhering components is to first cure the printed circuit, then apply an additional amount of uncured composition as a conductive adhesive for bonding the components.

Multiple-layer printed circuits may be made by starting with a circuit board made as above. Over the cured composition and prior to soldering of the circuit components, a thin layer of a non-conductive insulating thermosetting resin is applies with a screen or stencil printer. The layer applied should be patterned so as to allow vias or passages which remain uncoated with insulating material. After curing of this layer, a second layer of conductive composition, in the desired printed circuit pattern, may be printed over the insulating layer. The vias or passages would then allow electrical interconnection between the upper and lower layers. In this fashion, a two-layer printed circuit is made. The process may then be repeated multiple times to create a printed circuit containing a plurality of layers. Electronic components may then be attached as described before.

Yet another method for creating a multiple-layered printed circuit is to begin with a series of thin substrates with vias or passages drilled or punched therein. The conductive composition is then screen- or stencil-printed onto each of these substrates in the desired printed circuit pattern, each layer generally being different. The compositions may then be cured, or simply dried and left uncured while the thin substrates are aligned and laminated together under pressure. The laminating pressure will force the conductive layers to interconnect through the vias and passages in the thin substrates, interconnection being made wherever there exists conductive composition directly beneath a via or passage. Curing of the composition may be done before, during or after this laminating process. The result is a multiply-layered printed circuit.

The invention may be better understood with reference to the accompanying examples, which are intended for purposes of illustration only.

EXAMPLE 1

A 2-mil film of PEI (available as G.E. Ultem® 1000, Waterford N.Y.) was laminated to a 2-mil film of a B-staged epoxy-glass prepreg substrate material (available as FR4, General Electric, Coshockton, Ohio) by vacuum hot press lamination at 302° F. (150° C.) for 30 minutes, followed by a one hour ramp down to room temperature. The vacuum hot-press lamination was run on a 12 inch by 18 inch press of standard design incorporating heat, pressure and vacuum control. A vacuum was applied to the stack of materials to be laminated prior to the heatup and pressure steps to eliminate gas pockets within the laminate. The materials were then heated to 345±5° F. (175±5° C.) and 200–250 psi (1.38–1.72 MPa) pressure. The full pressure was applied within 30 seconds of the start. The temperature and pressure were held constant for 45 minutes. The material was then cooled to a maximum of 120° F. (50° C.) before pressure was released. The resultant composite was a fully cured and hardened, level, bubble-free laminate.

A conductive ink composition was prepared having the following composition by weight: 59.2% avg. 8μ copper powder; 27.7% avg. 20μ Sn/Pb alloy powder; 2.7% avg. 15μ Ag-coated Ni powder; 8.0% bisphenol A/butyl carbitol (1:1 weight); and 2.4% methyltetrahydrophthalic anhydride/ glycerol ester (1:1 molar). The ink was applied to the composite laminate and to a standard FR4 epoxy-glass substrate and cured under a hot air knife at 350° C. and a conveyor speed of 6 inches per minute. The adhesion of 20 AWG tin-coated copper wires soldered to 4 mm² lands of the conductive ink was determined by a 90° tension pull test. A 2 mm by 2 mm square land of the electrically-conductive ink cured on the substrate was dipped in molten tin-lead solder (63/37) at a temperature of 500±10° F. (205±2° C.) for 20 seconds, removed and allowed to cool to room temperature. To this land of tinned conductive ink a 20 AWG tin coated copper wire of approximately 1 inch in length is hand-soldered at an angle of 90° from the surface of the substrate at a solder iron temperature of 500±10° F. (260±5° C.). The 20 AWG wire is then pulled at an angle of 90° from the substrate and the force necessary to break the substrate-to-ink bond is measure. The results are reported in Table 3.

TABLE 3

| Substrate | Average Adhesion (kg/mm₂) | Standard Deviation (kg/MM²) |
| --- | --- | --- |
| epoxy-glass (FR4) | 0.05 | 0.02 |
| epoxy-glass/PEI laminate | 1.05 | 0.40 |

Similar results were obtained using paper-phenolic (available from ITEN Industries, Ashtabula, Ohio and polyimide (Kapton, available from DuPont, Wilmington, Del.) base layers.

Example 2

A uniform 1-mil thick layer of Mavidon 350CC (a proprietary single component liquid aromatic epoxy available from Mavidon Corporation, Palm City, Fla.) was spread on a 0.060 inch thick sample of FR-4 epoxy-glass laminate (available from General Electric, Coshockton, Ohio). This material was then heated to 60±5° C. for approximately 15 minutes to effect a B-stage cure of the Mavidon 350CC epoxy film. An electrically conductive ink was then applied to the B-stage cured epoxy coated FR-4, and subsequently cured under a hot air knife at 350° C. at a belt speed of 5.0 inches/minute with a gun-to-material gap of approximately ⅝ inch (15.9 mm). The adhesion of 20 AWG tin-coated copper wires soldered to 4 mm² lands of the conductive ink was determined by a 90° tension pull test as described in Example 1. The results are reported in Table 4.

TABLE 4

| Substrate | Average Adhesion (kg/mm²) | Standard Deviation (kg/mm²) |
| --- | --- | --- |
| epoxy-glass (FR4) | 0.05 | 0.02 |
| Mavidon 350CC/FR-4 | 0.56 | 0.11 |

From the foregoing description, one skilled in the art can readily ascertain the essential characteristics of the invention and, without departing from the spirit and scope thereof, can adapt the invention to various usages and conditions. Changes in form and substitution of equivalents are contemplated as circumstances may suggest or render expedient, and although specific terms have been employed herein, they are intended in a descriptive sense and not for purposes of limitation.

What is claimed is:

1. A printed circuit board comprising:
   (a) a substrate comprising:
      a substrate base layer; and
      at least one adherent layer fixedly attached to the substrate base layer, said at least one adherent layer comprising a thermoplastic material having a heat deflection temperature in the range of about 180° C. and about 245° C., said at least one adherent layer serving to provide a surface; and
   (b) conductive traces, comprising an electrically conductive adhesive composition, that form an electrical interconnect pattern bonded onto said surface of said at least one adherent layer, wherein the electrically conductive adhesive composition comprises (1) a high melting point metal, (2) a low melting point metal, (3) a cross-linking agent mixture comprising a protected curing agent and (4) at least one of (i) a resin or (ii) a reactive monomer or polymer which can be cross-linked by the curing agent.

2. The printed circuit board according to claim 1 wherein said substrate base layer has a decomposition temperature that is higher than the curing temperature of said electrically conductive adhesive composition.

3. The printed circuit board according to claim 1 wherein said thermoplastic material is selected from the group consisting of polyetherimides, polyethersulfones, polyarylsulfones, polyimides, polyimidesiloxanes, and aromatic polyesters.

4. The printed circuit board according to claim 1 wherein said substrate base layer comprises a metal and said at least one adherent layer electrically insulates said conductive traces from said substrate base layer.

5. The printed circuit board according to claim 4 wherein the metal has a melting point of at least 250° C.

6. The printed circuit board according to claim 1 wherein said electrically conductive adhesive composition comprises the resin and the reactive monomer or polymer which can be cross-linked by said curing agent.

7. The printed circuit board according to claim 1 wherein the high melting point metal is selected from the group consisting of copper, silver, aluminum, gold, platinum, palladium, beryllium, rhodium, nickel, cobalt, iron, molybdenum, and alloys thereof.

8. The printed circuit board according to claim 7 wherein the low melting point metal is selected from the group consisting of tin, bismuth, lead, cadmium, zinc, gallium, indium, tellurium, mercury, thallium, antimony, selenium, and alloys thereof.

9. The printed circuit board according to claim 1 wherein the low melting point metal is selected from the group consisting of tin, bismuth, lead, cadmium, zinc, gallium, indium, tellurium, mercury, thallium, antimony, selenium, and alloys thereof.

10. The printed circuit board according to claim 1 wherein the electrically conductive adhesive composition comprises:
    (1) 1–65% of a metal powder selected from the group consisting of copper, silver, aluminum, gold, platinum, palladium, beryllium, rhodium, nickel, cobalt, iron, molybdenum and alloys thereof;
    (2) 6–65% of a solder wherein said solder is selected from the group consisting of Sn, Bi, Pb, Cd, Zn, Ga, In, Te, Hg, Tl, Sb, Se, and alloys thereof;
    (3) 0.01–61% of a chemically protected cross-linking agent with fluxing properties; and
    (4) (i) 1–45% of the resin or (ii) 1–50% of the reactive monomer or polymer, with all percentages based on volume.

11. The printed circuit board according to claim 10 wherein said solder is a metal mixture that includes a metal additive that raises the melting temperature of the solder, said metal additive is selected from the group consisting of nickel and silver wherein said metal additive comprises 1 to 10 weight percent of the total metals content of the composition.

12. The printed circuit board according to claim 10 wherein said solder powder is an alloy comprising Sn63Pb37.

13. The printed circuit board according to claim 10 wherein said chemically protected cross-linking agent with fluxing properties is an acid or a strong base which is protected so as to become reactive only at or near a time at which the solder powder is melted.

14. The printed circuit board according to claim 13 wherein said acid or strong base is selected from the group consisting of anhydrides, carboxylic acids, amides, imides, amines, alcohols, phenols, aldehydes, ketones, nitro compounds, nitriles, carbamates, isocyanates, amino acids, peptides, thiols, sulfonamides, semicarbazones, oximes, hydrazones, cyanohydrins, ureas, phosphoric acids, phosphoric esters, thiophosphoric acids, thiophosphoric esters, phosphonic acids, phosphonic esters, phosphites, phosphonamides, sulfonic acids and sulfonic esters.

15. The printed circuit board according to claim 13 wherein said acid or strong base is an anhydride.

16. The primed circuit board according to claim 10 wherein the metal powder comprises 13–65% by volume of said composition.

17. The printed circuit board according to claim 16 wherein the solder comprises 6–29% by volume of said composition, the cross-linking agent comprises 7–60% by volume of said composition, and the resin comprises 1–15% or the reactive monomer or polymer comprises 1–32% by volume of said composition.

* * * * *